Dec. 11, 1956 P. G. HANSEL 2,774,037

FREQUENCY COINCIDENCE INDICATOR

Filed April 7, 1953

INVENTOR.
PAUL G. HANSEL
BY
Harry M. Saragovitz
Attorney

United States Patent Office 2,774,037

Patented Dec. 11, 1956

2,774,037

FREQUENCY COINCIDENCE INDICATOR

Paul G. Hansel, Greenvale, N. Y., assignor to the United States of America as represented by the Secretary of the Army Application April 7, 1953, Serial No. 347,245

6 Claims. (Cl. 324—79)

This invention relates to apparatus for indicating coincidence in frequency between first and second signals, and more particularly to apparatus for indicating frequency coincidence between a calibrating signal and a signal from a signal generator which is to be calibrated.

A known method for quickly and accurately frequency-calibrating the tuning scale of signal generators comprises placing a photo-sensitive material on the tuning scale, sweeping the tuning of the signal generator over its tuning range, and flashing light from a flash tube on the photo-sensitive material at the instants the frequency of the signal generator coincides with certain known fixed frequencies. Upon development of the photo-sensitive material, lines will appear on the tuning scale which are indicative of the known fixed frequencies. The present invention provides improved means for producing a signal to flash the flash tube at those instants the frequency of the signal generator coincides with each of the certain known fixed frequencies.

Although this invention is particularly well suited for use in the above-described method for frequency-calibrating the tuning scale of a signal generator, it is equally useful wherever it is desired to produce an effect dependent on frequency coincidence between two signals.

It is an object of this invention to provide improved apparatus for indicating coincidence in frequency between two signals.

It is a further object of this invention to provide improved apparatus for indicating coincidence in frequency between the output of a signal generator to be calibrated and calibration signals having certain known fixed frequencies.

It is a further object also of this invention to provide improved apparatus which indicates frequency coincidence between two signals by developing a signal having a maximum amplitude of a first frequency component and a minimum amplitude of a second frequency component.

In brief, the invention contemplates suppressed-carrier modulating a first signal with a modulating signal, and heterodyning the suppressed-carrier modulation output with a second signal. As will be shown hereinafter, the heterodyned output will include a first beat frequency having a frequency twice that of said modulating signal which will have a minimum amplitude when the first and second signals coincide in frequency, and a second beat frequency equal to that of the modulating signal which will have a maximum amplitude when the first and second signals coincide in frequency. By passing the heterodyned output through a frequency selective means tuned to either the frequency of the modulating signal or twice the frequency of the modulating signal, and then through a peak amplitude detector, an output signal will be obtained which is indicative of frequency coincidence between the first and second signals. It will be seen that the present invention has the advantage that the precise center frequency of the frequency selective means does not enter into the accuracy of the indication of frequency coincidence.

Other and further objects of this invention will become apparent from the following description taken together with the accompanying drawing, wherein.

Figure 1:
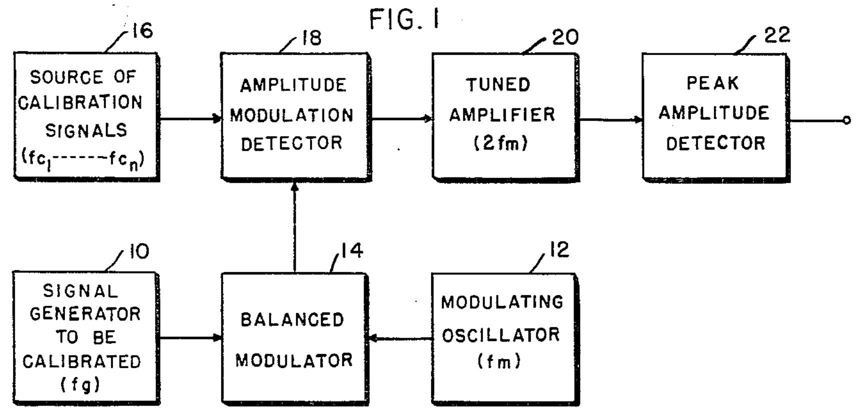
Fig. 1 shows a block diagram of one embodiment of the invention.

Referring to Fig. 1, the signal generator to be calibrated 10, produces a first signal having a variable frequency $f_g$. This signal, together with a signal from a modulating oscillator 12, producing a modulating signal having a fixed frequency $f_m$, are applied to a carrier-suppressing modulator such as balanced modulator 14. The output of source of calibration signals 16, producing a second signal having fixed frequency components $f_{c_1}$—$f_{c_n}$, and the output of balanced modulator 14 are applied to a heterodyning means, such as amplitude modulation detector 18. The output of amplitude modulation detector 18 is applied to a frequency selective means, such as tuned amplifier 20, which is tuned to a frequency $2f_m$. The output of tuned amplifier 20 is applied to peak amplitude detector 22.

Figure 2:
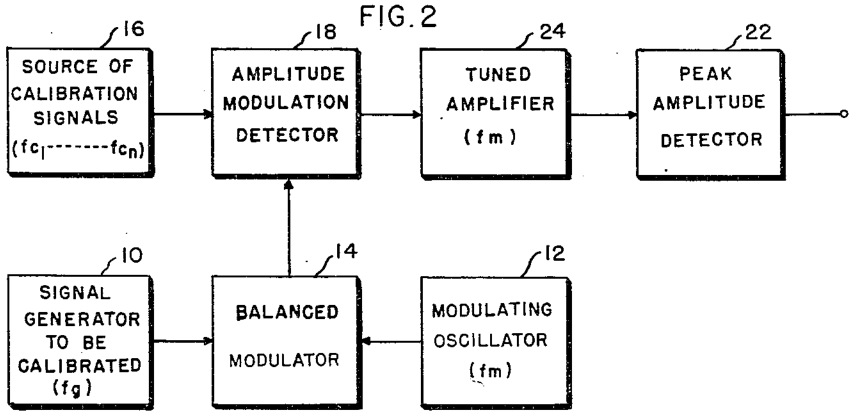
Fig. 2 shows a block diagram of another embodiment of the invention.

In Fig. 2, elements which correspond in structure and function with elements of Fig. 1 are identified with identical reference numerals.

The apparatus shown in Fig. 2 is similar to the apparatus shown in Fig. 1, except that tuned amplifier 24, tuned to a frequency $f_m$, is substituted for tuned amplifier 20, tuned to a frequency $2f_m$.

In operation, the frequency of $f_g$ of signal generator 10 is varied over its tuning range. The output of balanced modulator 14 will include only upper and lower side bands $f_g+f_m$ and $f_g-f_m$ respectively. As is well known when a suppressed-carrier modulation signal is applied to a heterodyning means such as an amplitude modulation detector, the two side band components beat against each other to produce a 100% second harmonic distortion. Amplitude modulation detector 18 will thus have an output of $2f_m$. Now as signal generator 10 is varied in frequency, the two side bands will eventually become centered about and in phase with one of the calibration signals. The calibration signal will under such circumstances effectively replace the missing carrier in the carrier-suppressed output of balanced modulator 14, thereby reducing the second harmonic output $2f_m$ to a minimum value and increasing the fundamental modulation component $f_m$ to a maximum value. The output of amplitude modulation detector 18 is passed either through a tuned amplifier 20 tuned to $2f_m$, as in Fig. 1, or through a tuned amplifier 24 tuned to $f_m$, as in Fig. 2, and the output thereof is integrated by peak amplitude detector 22.

Figure 3:
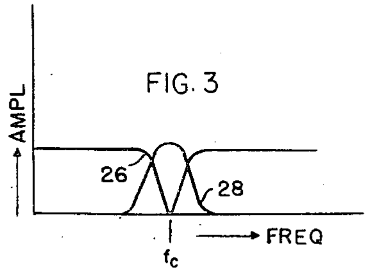
Fig. 3 shows graphs of the output signals obtained from both embodiments.

Fig. 3 shows the amplitude of the output of peak amplitude detector 22 as signal generator 10 is swept through one of the calibrating signal frequencies $f_c$. Curve 26 is obtained when tuned amplifier 20 of Fig. 1 is employed, and curve 28 is obtained when tuned amplifier 24 of Fig. 2 is employed. As can be seen from curves 26 and 28 a sharper indication is obtained when the tuned amplifier is tuned to a frequency of $2f_m$. Therefore, the apparatus shown in Fig. 1 is to be preferred over that of Fig. 2.

In order to avoid confusion between adjacent frequency components of the calibration signals, the frequency $f_m$ of the modulating signal should be small relative to the spacing between adjacent frequency components.

The various components indicated in block form are well known and the circuits thereof may be found in any standard reference work, such as Terman's "Radio Engineer's Handbook." The balanced modulator should preferably be of the type which will suppress both the carrier and modulating signal, such as the type described on pp. 538–541 of "Radio Engineering," vol. 1, by E. K. Sandeman, published in 1948 by John Wiley & Sons, Inc., New York, N. Y.

It is to be understood that the specific embodiments herein disclosed are merely illustrative and not meant to limit the invention. It is intended by the accompanying claims to claim all such modifications, variations and equivalents as fairly fall within the scope and spirit of this invention.

What is claimed is:

1. An apparatus for indicating coincidence in frequency between first and second signals, comprising: means for generating a modulating signal; a carrier-suppressing modulator; means for applying said first signal and said modulating signal to said modulator, whereby the output thereof contains the sum and difference frequencies of said first signal and modulating signal; means for heterodyning said second signal and the output of said modulator to derive a beat frequency signal having a frequency twice that of said modulating signal and having a minimum amplitude when said first and second signals coincide in frequency; and frequency selective means coupled to said heterodyning means, said frequency selective means being tuned to said beat frequency.

2. An apparatus in accordance with claim 1, further including a peak amplitude detector coupled to said frequency selective means.

3. An apparatus in accordance with claim 1, wherein said heterodyning means is an amplitude modulation detector.

4. In a system for frequency calibrating a signal generator which is tunable over a given frequency range; means for generating a fixed-frequency modulating signal; a carrier-suppressing modulator; means for applying said modulating signal and a signal from said signal generator to said modulator; whereby the output of said modulator contains only the sum and difference frequencies of the signal from said signal generator and said modulation signal; a source of calibration signals within said frequency range; amplitude modulation detector means for heterodyning said calibration signal with the output of said modulator, whereby as said signal generator has its frequency swept over said frequency range the output of said heterodyning means includes a first beat frequency signal having a frequency twice that of said modulating signal and a second beat frequency signal having a frequency signal equal to that of said modulating signal, said first beat frequency signal having a minimum amplitude and said second beat frequency signal having a maximum amplitude when said signal from said signal generator and said fixed frequency component of said calibrating signal coincide in frequency; and means coupled to said amplitude modulation detector means and tuned to said first beat frequency signal for producing an output signal indicative of coincidence in frequency between said signal from said signal generator and said calibrating signal.

5. Apparatus in accordance with claim 4, wherein said last-named means further includes a peak amplitude detector coupled to said frequency selective means.

6. A system as set forth in claim 4, wherein said source of calibration signals provides a plurality of spaced, fixed-frequency components within said frequency range, the frequency of said modulation signal being small relative to the frequency separation of adjacent frequency components of said source.

References Cited in the file of this patent

UNITED STATES PATENTS

| | | |
|---|---|---|
| 2,489,296 | Koechlin | Nov. 29, 1949 |
| 2,557,817 | Dutton | June 19, 1951 |
| 2,629,829 | Daly | Feb. 24, 1953 |